(12) United States Patent
Zhou et al.

(10) Patent No.: US 11,011,649 B2
(45) Date of Patent: May 18, 2021

(54) OXIDE SEMICONDUCTOR DEVICE AND METHOD OF MANUFACTURING THE SAME

(71) Applicant: UNITED MICROELECTRONICS CORP., Hsin-Chu (TW)

(72) Inventors: Zhibiao Zhou, Singapore (SG);
Shao-Hui Wu, Singapore (SG);
Chen-Bin Lin, Taipei (TW);
Ding-Lung Chen, Singapore (SG);
Chi-Fa Ku, Kaohsiung (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 18 days.

(21) Appl. No.: 16/027,386

(22) Filed: Jul. 5, 2018

(65) Prior Publication Data

US 2018/0331233 A1    Nov. 15, 2018

Related U.S. Application Data

(62) Division of application No. 15/059,311, filed on Mar. 3, 2016, now Pat. No. 10,043,917.

(51) Int. Cl.
| | |
|---|---|
| *H01L 29/10* | (2006.01) |
| *H01L 29/786* | (2006.01) |
| *H01L 29/66* | (2006.01) |
| *H01L 21/426* | (2006.01) |
| *H01L 27/12* | (2006.01) |
| *H01L 29/49* | (2006.01) |

(52) U.S. Cl.
CPC ...... *H01L 29/78696* (2013.01); *H01L 21/426* (2013.01); *H01L 27/1225* (2013.01); *H01L 29/4908* (2013.01); *H01L 29/66969* (2013.01); *H01L 29/7869* (2013.01); *H01L 29/78606* (2013.01); *H01L 29/78609* (2013.01); *H01L 29/78648* (2013.01)

(58) Field of Classification Search
CPC ............. H01L 21/02554; H01L 21/426; H01L 29/66969; H01L 29/78606; H01L 29/78648; H01L 29/7869; H01L 29/78696
USPC ........................................... 257/43; 438/104
See application file for complete search history.

(56) References Cited

U.S. PATENT DOCUMENTS

| | | | |
|---|---|---|---|
| 5,879,958 | A | 3/1999 | Kawahata |
| 7,379,136 | B2 | 5/2008 | Yang |
| 7,952,392 | B2 | 5/2011 | Koyama |
| 7,977,675 | B2 | 7/2011 | Kawamura |

(Continued)

OTHER PUBLICATIONS

Min et al., "Inductively coupled plasma reactive ion etching of ZnO films in HBr/Ar plasma," Thin Solid Films 516 (2008) pp. 3521-3529.*

(Continued)

*Primary Examiner* — Jay C Kim
(74) *Attorney, Agent, or Firm* — Winston Hsu

(57) ABSTRACT

An oxide semiconductor device and a method for manufacturing the same are provided in the present invention. The oxide semiconductor device includes a back gate, an oxide semiconductor film, a pair of source and drain electrodes, a gate insulating film, a gate electrode on the oxide semiconductor film with the gate insulating film therebetween, an insulating layer covering only over the gate electrode and the pair of source and drain electrodes, and a top blocking film over the insulating layer.

9 Claims, 8 Drawing Sheets

(56) References Cited

U.S. PATENT DOCUMENTS

| | | |
|---|---|---|
| 8,300,201 B2 | 10/2012 | Yamazaki |
| 8,368,067 B2 | 2/2013 | Uchiyama |
| 8,377,744 B2 | 2/2013 | Yamazaki |
| 8,518,755 B2 | 8/2013 | Yamazaki |
| 8,530,289 B2 | 9/2013 | Yamazaki |
| 8,551,824 B2 | 10/2013 | Yamazaki |
| 8,643,008 B2 | 2/2014 | Yamazaki |
| 8,859,330 B2 | 10/2014 | Koezuka |
| 8,901,555 B2 | 12/2014 | Yeh |
| 8,956,912 B2 | 2/2015 | Yamazaki |
| 8,969,182 B2 | 3/2015 | Koezuka |
| 9,006,024 B2 | 4/2015 | Akimoto |
| 9,130,044 B2 | 9/2015 | Okazaki |
| 9,153,436 B2 | 10/2015 | Yamazaki |
| 9,214,474 B2 | 12/2015 | Yamazaki |
| 9,257,564 B2 | 2/2016 | Lee |
| 9,285,619 B2 | 3/2016 | Yamayoshi |
| 9,356,123 B2 | 5/2016 | Zhang |
| 9,406,760 B2 * | 8/2016 | Shimomura ............ H01L 29/24 |
| 9,466,615 B2 * | 10/2016 | Miyairi ............ H01L 27/10873 |
| 2004/0051101 A1 | 3/2004 | Hotta |
| 2009/0170248 A1 | 7/2009 | Kim |
| 2010/0148168 A1 | 6/2010 | Lai |
| 2012/0097952 A1 | 4/2012 | Kang |
| 2012/0295397 A1 | 11/2012 | Koezuka |
| 2013/0258746 A1 | 10/2013 | Kurokawa |
| 2013/0288426 A1 | 10/2013 | Akimoto |
| 2015/0028326 A1 | 1/2015 | Kenji |
| 2015/0091005 A1 | 4/2015 | Park |
| 2015/0155362 A1 | 6/2015 | Nakazawa |
| 2015/0179803 A1 | 6/2015 | Yamazaki |
| 2015/0179810 A1 | 6/2015 | Yamazaki |
| 2016/0118244 A1 | 4/2016 | Hayashi |
| 2016/0260838 A1 * | 9/2016 | Yamazaki ........... H01L 29/7869 |

OTHER PUBLICATIONS

Marrs et al., "Comparison of wet and dry etching of zinc indium oxide for thin film transistors with an inverted gate structure," Journal of Vacuum Science & Technology A 30 (2012) 011505.*

Toshio Kamiya et al., "Material characteristics and applications of transparent amorphous oxide semiconductors", NPG Asia Materials 2, 2009 Tokyo Institute of Technology, vol. 2, Jan. 2010, p. 15-22.

* cited by examiner

OXIDE SEMICONDUCTOR DEVICE AND METHOD OF MANUFACTURING THE SAME

CROSS REFERENCE TO RELATED APPLICATIONS

This application is a divisional of application Ser. No. 15/059,311, filed on Mar. 3, 2016 and entitled "OXIDE SEMICONDUCTOR DEVICE AND METHOD OF MANUFACTURING THE SAME", which is incorporated herein by reference.

BACKGROUND OF THE INVENTION

1. Field of the Invention

The present invention relates generally to an oxide semiconductor device and a method of manufacturing the same, and more particularly, to an oxide semiconductor device with precise doping control in defined areas and a method of manufacturing the same.

2. Description of the Prior Art

A technique for forming a transistor by using a semiconductor over a substrate having an insulating surface has attracted attention. The transistor is applied to a wide range of semi-conductor devices such as an integrated circuit and a display device. A silicon layer is known as a semiconductor applicable to a transistor.

Whether an amorphous silicon layer or a polycrystalline silicon layer is used as a semiconductor in a transistor depends on the purpose. For example, in the case of a transistor included in a large display device, an amorphous silicon layer, which can be formed using an established technique for forming a film over a large substrate, is preferably used. On the other hand, in the case of a transistor included in a high-performance display device where driver circuits are formed over the same substrate, a poly-crystalline silicon layer, which can form a transistor having high field-effect mobility, is preferably used. As a method for forming a polycrystalline silicon layer, high-temperature heat treatment or laser light treatment which is performed on an amorphous silicon layer has been known.

In recent years, an oxide semiconductor has attracted attention. An oxide semiconductor can be formed by a sputtering method or the like, and thus can be used for a semiconductor of a transistor in a large display device. A transistor including an oxide semi-conductor has high field-effect mobility, thus a high performance display device where driver circuits are formed over the same substrate can be obtained. In addition, there is an advantage that capital investment can be reduced because part of production equipment for a transistor including an amorphous silicon layer can be retrofitted and utilized.

Generally, reducing oxygen vacancies in the oxide semiconductor film is very important in order to provide an oxide semiconductor with stable electrical characteristics. One relevant approach is to supply or dope the oxygen into the film in contact with the oxide semiconductor film. When oxygen is added directly to the oxide semiconductor film, the crystal structure of the oxide semiconductor film is disordered, which causes a reduction in crystallinity. As a result, variation in electrical characteristics of a transistor including an oxide semiconductor can be reduced and reliability can be improved.

Although the electrical characteristics of the oxide semiconductor can be improved by the oxygen supply, there are still other problems to overcome. For the oxide semiconductor devices with different pattern densities, sizes and length/width ratios (L/W), it is difficult to reach an optimized doping condition for different oxide semiconductor devices in one substrate or wafer. The pattern loading effect would cause a significant variation in the electrical characteristics, e.g. a shift of threshold voltage, of the devices. A better solution is still necessary to improve the reliability of the oxide semiconductor device in this technical field.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

It is a new process concept to solve the pattern density and L/W dependency issue in the manufacture of the oxide semiconductor devices, such as the oxide semiconductor field effect transistor (OS FET). Precisely controlled oxygen implantation can provide adjusted and optimized dosage, intensity and energy for every precisely defined area, which may support various OS FET devices for different applications.

In one aspect of the embodiments, there is provided an oxide semiconductor device, including a substrate, a back gate on the substrate, abase insulating film over the back gate and the substrate, an oxide semiconductor film on the base insulating film, a pair of source and drain electrodes each electrically connected to the oxide semiconductor film, a gate insulating film over the oxide semiconductor film and the pair of source and drain electrodes, a gate electrode on the oxide semiconductor film with the gate insulating film therebetween, an insulating layer covering only over the gate electrode and the pair of source and drain electrodes, and a top blocking film over said insulating layer.

In another aspect of the embodiments, there is provided a method for manufacturing an oxide semiconductor device, including steps of forming oxide-semiconductor devices on a substrate, forming an insulating layer over the oxide-semiconductor devices, forming a first mask on the insulating layer to define a first implantation region, performing a first oxygen implantation process on the first implantation region, forming a second mask on the insulating layer to define a second implantation region, and performing a second oxygen implantation process on the second implantation region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
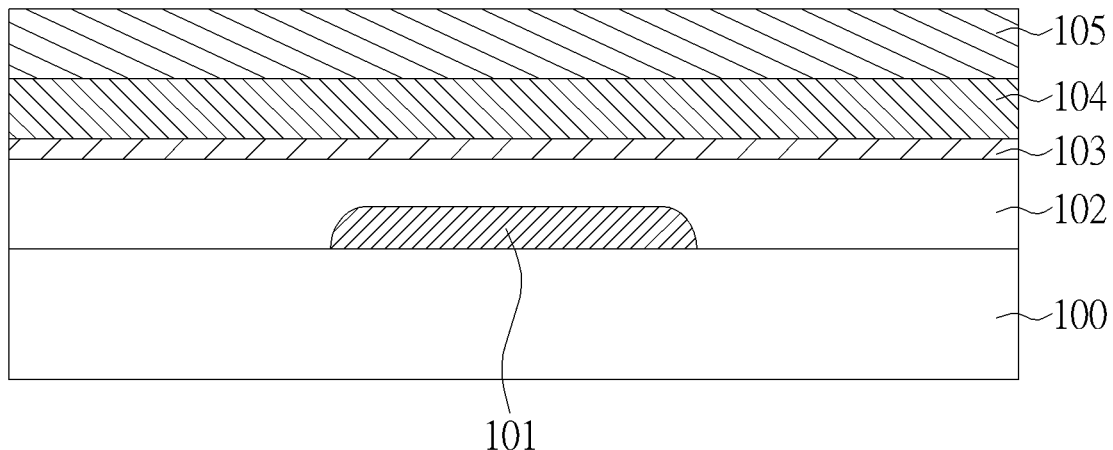
FIG. 1 illustrates a cross-sectional view of forming a back gate and a stack of a base insulating film, a blocking film, an oxide semiconductor film and a conductive film on a substrate according to one embodiment.

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the embodiments. Note that the size, the thickness of films (layers), or regions in diagrams may be exaggerated for clarity.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a method of manufacturing an oxide semiconductor device according to an embodiment of the present invention will be described with reference to FIGS. 1 to 10, which are cross-sectional views taken along a line transversal across the patterns of gate electrode and back gate. In FIGS. 1 to 10, some components are enlarged, reduced in size, or omitted for easy understanding and preventing obscuring the subject matters of the present invention.

[Structure of Device]

Figure 5:
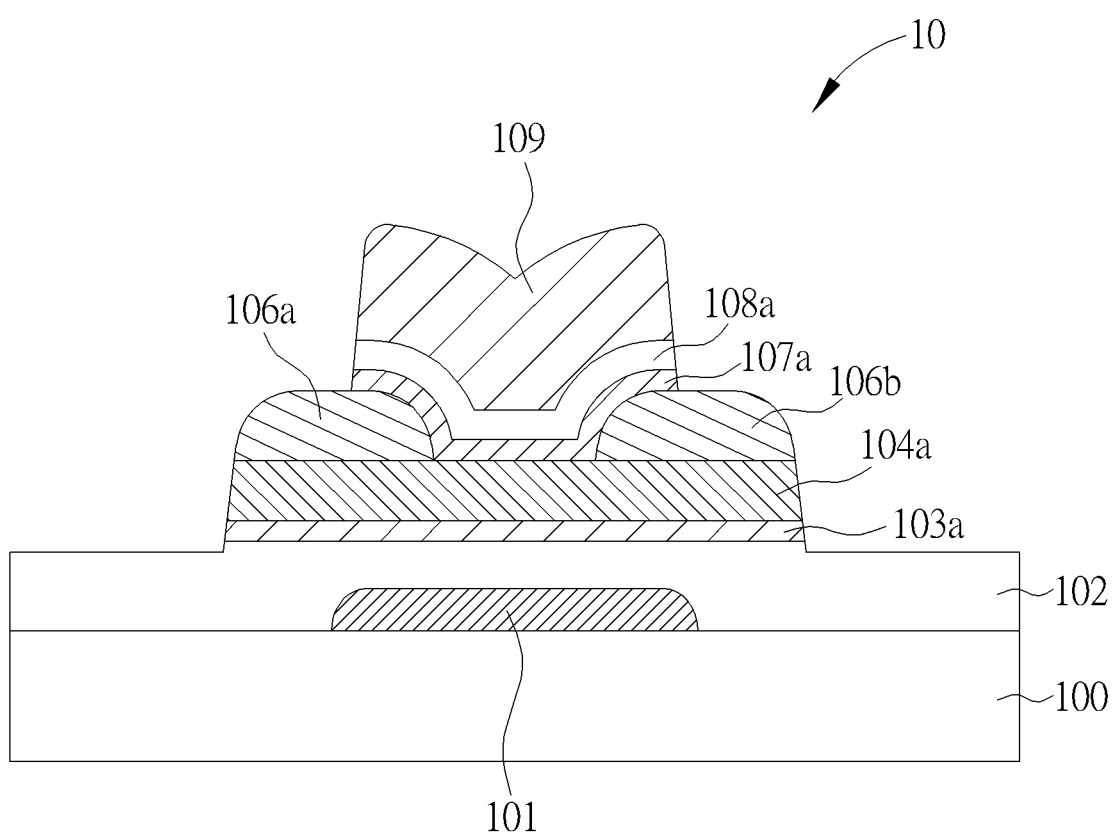
FIG. 5 illustrates a cross-sectional view of forming a gate electrode on the pattern of the oxide semiconductor device according to one embodiment according to one embodiment.

First, an exemplary oxide semiconductor device 10 of the present invention is illustrated in FIG. 5 for an advance understanding. The general oxide semiconductor device 10, for example an oxide semiconductor field effect transistor (OS FET), may include a conductive film (back gate) 101 over the substrate 100, the base insulating film 102 over the substrate 100 and the back gate 101, a bottom blocking film 103a over the base insulating film 102, a first oxide semiconductor film 104a over the bottom blocking film 103a, a pair of source and drain electrodes 106a and 106b on the top surface of the first oxide semiconductor film 104a, a second oxide semiconductor film 107a in contact with the first oxide semi-conductor film 104a and the pair of source and drain electrodes 106a and 106b, a gate insulating film 108a over the second oxide semiconductor film 107a, and a gate electrode 109 overlapping with the second oxide semiconductor film 107a with the gate insulating film 108a provided therebetween. The oxide semiconductor device 10 described in this embodiment has a dual-gate structure (i.e. a bottom back gate 101 and a top gate electrode 109).

There is no particular limitation on the property of a material and the like of the substrate 100 as long as the material has heat resistance enough to withstand at least later heat treatment. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100.

The back gate (film) 101 can be formed using a metal element selected from aluminum, chromium, copper, tantalum, titanium, molybdenum, and tungsten, or an alloy containing any of these metal elements in combination, with a single-layer structure or a stacked layer structure of two or more layers. Alternatively, the film of back gate 101 can also be formed using a light-transmitting conductive material such as an indium tin oxide or an indium oxide containing other metal elements.

The back gate 101 serves to further increase on-state current and to control the threshold voltage of the device. To increase the on-state current, for example, the gate electrode 109 and the back gate 101 are electrically connected to each other to have the same potential, and the transistor is driven as a dual-gate transistor. Alternatively, to control the threshold voltage, the gate electrode 109 and the back gate 101 are not electrically connected to each other so that a fixed potential, which is different from a potential of the gate electrode 109, is supplied to the back gate 101. Note that the gate electrode 109 can be formed using any of the materials used for the back gate 101. The material may be selected from TaN, TiN, ITO, AZO, NBT, IZO, $NaAl_xO_y$, $ZrCa_xO_y$, $Fe_3O_4$, $SrFeCo_xO_y$, $LaMo_xO_y$, or GZO in a single layer or being laminated with W, Ni or Ti film, etc.

The base insulating film 102 can be formed using, for example, silicon oxide, silicon oxynitride, silicon nitride, silicon nitride oxide, gallium oxide, hafnium oxide, yttrium oxide, aluminum oxide, or aluminum oxynitride. Note that when silicon nitride, gallium oxide, hafnium oxide, yttrium oxide, aluminum oxide, or the like is used for the base insulating film 102, it is possible to suppress diffusion of impurities such as an alkali metal, water, and hydrogen from the substrate 100 side into the oxide semiconductor film 104a.

The gate insulating film 108a can be formed to have a single-layer structure or a stacked-layer structure using, for example, any of silicon oxide, silicon oxynitride, silicon nitride oxide, silicon nitride, aluminum oxide, hafnium oxide, gallium oxide, a Ga—Zn— based metal oxide, and the like. The gate insulating film 108a may also be formed using a high-k material such as hafnium silicate ($HfSiO_x$), hafnium silicate to which nitrogen is added ($HfSi_xO_y$), hafnium aluminate to which nitrogen is added ($HfAl_xO_y$), hafnium oxide, or yttrium oxide, so that gate leakage current of the transistor can be reduced.

In the embodiment, for the film positioned near the oxide semiconductor film, as a typical example, at least one of the base insulating film 102 and the gate insulating film 108a is preferably an oxide insulating film containing nitrogen and having a small number of defects. When at least one of the base insulating film 102 and the gate insulating film 108a which are positioned near the oxide semiconductor film contains a small amount of nitrogen oxide as described above, the carrier trap at the interface between the base insulating film 102 and the first oxide semiconductor film 104a can be inhibited. Accordingly, a shift in the threshold voltage of the transistor included in the semiconductor device can be inhibited, which leads to a reduced change in the electrical characteristics of the transistor.

The bottom blocking film 103a serves as a barrier film that blocks oxygen, hydrogen, water, and the like. This means that the bottom blocking film 103a can prevent hydrogen and water from entering the first oxide semiconductor film 104a from the outside and can prevent oxygen in the first oxide semiconductor film 104a from being released to the outside. As the barrier film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, a titanium nitride and a tantalum nitride film can be given as examples. The titanium nitride (TiN) film or the tantalum nitride (TaN) film is preferred since it has a high shielding/blocking effect of preventing penetration of both oxygen and impurities such as hydrogen and moisture.

The first oxide semiconductor film 104a is formed using a metal oxide containing at least In or Zn, as a typical example, an In—Ga oxide, an In—Zn oxide, an In—Mg oxide, a Zn—Mg oxide, or an In-M-Zn oxide (M is Al, Ga, Sn, Y, Zr, La, Ce, Mg, or Nd) can be given. It is preferable that hydrogen and nitrogen be reduced as much as possible as well as the oxygen vacancies in the first oxide semiconductor film 104a. When the impurity concentration and density of defect states are low in the first oxide semiconductor film 104a, the device can have more excellent electrical characteristics.

The first oxide semiconductor film 104a may have a non-single-crystal structure, for example. The non-single crystal structure includes a c-axis aligned crystalline oxide semiconductor (CAAC-OS), a polycrystalline structure, a micro-crystalline structure, or an amorphous structure, for example. Among the non-single crystal structure, the amorphous structure has the highest density of defect levels, whereas CAAC-OS has small amounts of impurities and defects (e.g., oxygen vacancies). The oxygen vacancies in the oxide semiconductor film would serve as carrier traps or serve as carrier generation sources when hydrogen or nitrogen is captured therein.

The oxide semiconductor device 10 illustrated in FIG. 5 is provided with a multilayer film in oxide semiconductor portion. A second oxide semiconductor film 107a is formed in contact with the first oxide semiconductor film 104a and is overlapping with the top gate electrode 109. Part of the first oxide semiconductor film 104a serves as a channel region. The second oxide semiconductor film 107a contains one or more elements that form the first oxide semiconductor film 104a. Thus, interface scattering is unlikely to occur at the interface between the first oxide semiconductor film 104a and the second oxide semiconductor film 107a. The transistor can have high field effect mobility because the movement of carriers is not hindered at the interfaces. Furthermore, the amount of on-state current of the transistor and the field-effect mobility can be increased. The second oxide semiconductor film 107a may also block impurities from the outside, and accordingly, the amount of impurities that are transferred from the outside to the first oxide semiconductor film 104a and the number of oxygen vacancies in the oxide semiconductor film 104a can be reduced.

The second oxide semiconductor film 107a is formed using a metal oxide containing at least In or Zn, in which In is preferable because carrier mobility (electron mobility) can be increased. Typical examples of the metal oxide include an In—Ga oxide, an In—Zn oxide, an In—Mg oxide, a Zn—Mg oxide, and an In-M-Zn oxide (M represents Al, Ga, Sn, Y, Zr, La, Ce, Mg, or Nd). Like the first oxide semiconductor film 104a, the second oxide semiconductor film 107a may have a non-single-crystal structure, for example. The non-single crystal structure includes a c-axis aligned crystalline oxide semiconductor (CAAC-OS), a polycrystalline structure, a microcrystalline structure, or an amorphous structure, for example.

Please note that the second semiconductor film 107a is not necessary in the oxide semiconductor device 10. In some cases, the oxide semiconductor portion of the transistor only consists of the first semiconductor films 104a.

The pair of source and drain electrodes 106a and 106b is formed with a single-layer structure or a stacked-layer structure using any of metals such as aluminum, titanium, chromium, nickel, copper, yttrium, zirconium, molybdenum, silver, tantalum, and tungsten and an alloy containing any of these metals as a main component. Note that a transparent conductive material containing indium oxide, tin oxide, or zinc oxide may be used.

Since the pair of source and drain electrodes 106a and 106b are formed only on the top surface of the first oxide semiconductor film 104a, oxidation of the pair of source and drain electrodes 106a and 106b induced by oxygen from the base insulating film 102 can be suppressed. In the first oxide semiconductor film 104a, the channel length of a region overlapping with the pair of source and drain electrodes 106a and 106b is longer than the channel width of a region not overlapping with the pair of source and drain electrodes 106a and 106b (a region where a channel is formed). Accordingly, the channel width of the region not overlapping with source and drain electrodes 106a and 106b can be short, leading to the miniaturization of the transistor, and the area of a region where the first oxide semiconductor film 104 is in contact with source and drain electrodes 106a and 106b can be increased, leading to a reduction in contact resistance.

Please note that the oxide semiconductor device 10 illustrated in FIG. 5 is an exemplary structure of the present invention. Some modification may be made to the device for design requirement or function variety, for example for the miniaturization of the device or to achieve higher integration or better electrical characteristics. The disclosure should be construed as limited only by the metes and bounds of the appended claims.

[Method for Manufacturing the Device]

A method for manufacturing the oxide semiconductor device 10 in FIG. 5 is herein described with reference to FIGS. 1 to 10. Since the present invention is directed to the structure and the formation of oxide semiconductor, the process included in or relevant to the front-end-of-the-line (FEOL) and post back-end-of-the-line (BEOL) will be omitted for the clarity of the specification.

Please note that the films included in the oxide semiconductor device 10 (i.e., the insulating film, the oxide semiconductor film, the metal oxide film, the conductive electrodes, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Please refer to FIG. 1, a conductive film as back gate 101 is first formed over the substrate 100. A formation method of the back gate 101 is described below. First, a conductive film is formed by a sputtering method, a vacuum evaporation method, a pulsed laser deposition (PLD) method, a thermal CVD method, or the like and then a mask is formed over the conductive film by a lithography process. Next, the conductive film is partly etched using the mask to form the back gate 101. After that, the mask is removed. Note that the conductive film may also be formed by an electrolytic plating method, a printing method, an ink-jet method, or the like instead of the above formation method.

After that, a base insulating film 102 is formed over the substrate 100 and the back gate 101. Then, planarization treatment is performed on the base insulating film 102 so that the base insulating film 102 is formed. The base insulating film 13 is formed by a sputtering method, a CVD method, a vacuum evaporation method, a pulsed laser deposition (PLD) method, a thermal CVD method, or the like.

Next, a stack including a bottom blocking film 103, a first oxide semiconductor film 104 and the conductive film 105 is formed over the base insulating film 102. Please refer to previous paragraphs for materials and formation methods of the bottom blocking film 103, the first oxide semiconductor film 104 and the conductive film 105. No redundant and repetitive description will be given hereinafter for the clarity of the disclosure.

Figure 2:
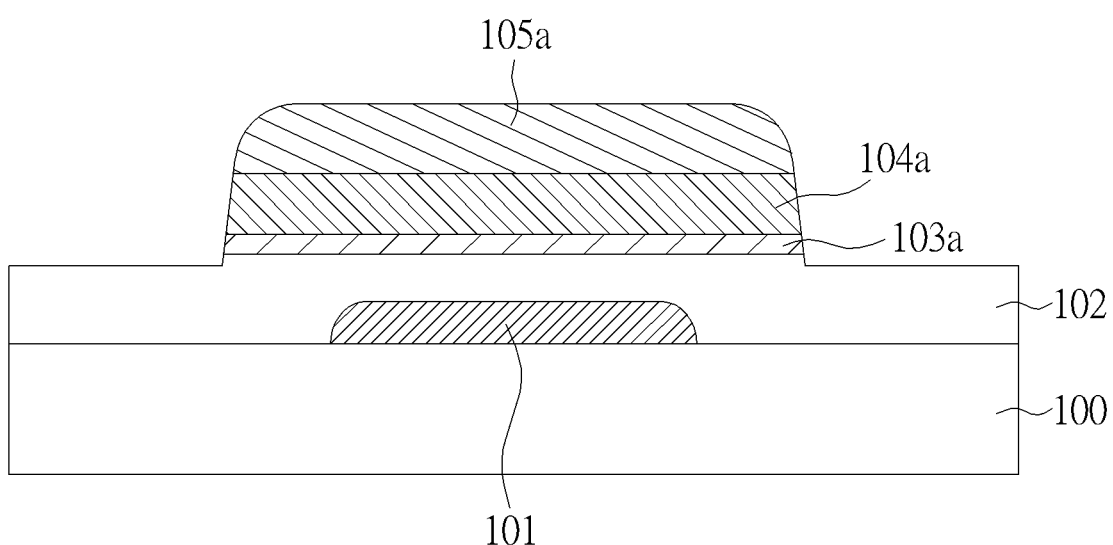
FIG. 2 illustrates a cross-sectional view of performing an etch process on the film stack to define the pattern and region of an oxide semiconductor device according to one embodiment.

After the stack of substrate 100, back gate 101, bottom blocking film 103, the first oxide semiconductor film 104 and the conductive film 105 shown in FIG. 1 is formed, please refer to FIG. 2, the conductive film 105 is etched first so that the conductive film 105a is formed to define the pattern and region of the oxide semiconductor device. A photoresist (not shown) may be formed first on the conductive film 105 to define this pattern. Subsequently, the first oxide semiconductor film 104a and the bottom blocking film 103a are etched using the conductive film 105a as a mask so that the first oxide semiconductor film 104a and the bottom blocking film 103a matching the device region are formed.

Figure 3:
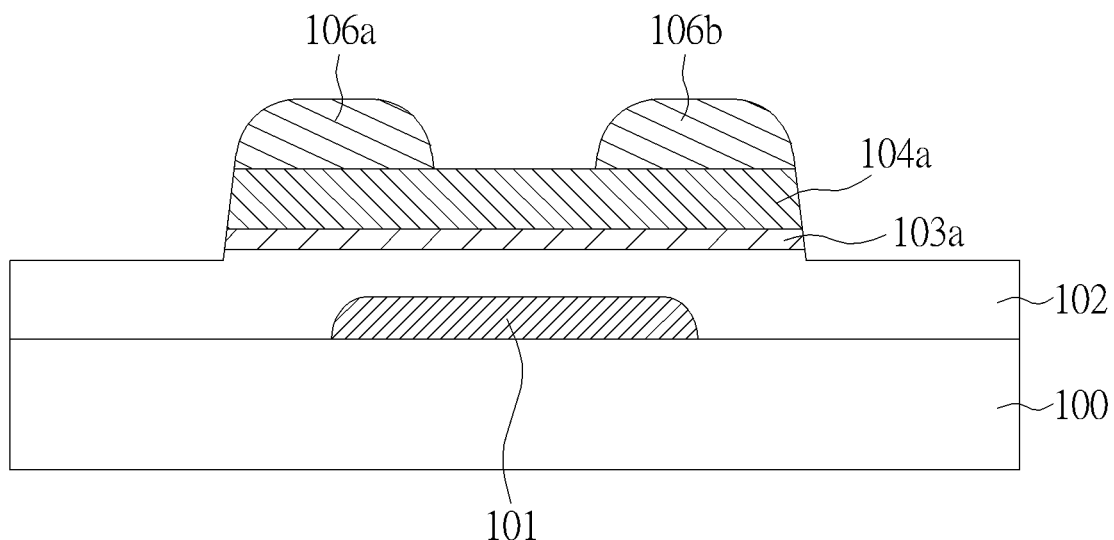
FIG. 3 illustrates a cross-sectional view of forming a pair of source and drain electrodes on the oxide semiconductor film according to one embodiment.

After the stack of conductive film 105a, the first oxide semiconductor film 104a and the bottom blocking film 103a is shaped into the device pattern, please refer to FIG. 3, the conductive film 105a is etched so that the pair of source and drain electrodes 106a and 106b is formed on top surface of the first oxide semiconductor film 104a. A photoresist (not shown) may be formed first on the conductive film 105a 105 to define the pattern of source and drain electrodes 106a and 106b. A dehydrogenation or dehydration process may be performed by heat treatment after the first oxide semiconductor film 104a is formed.

Figure 4:
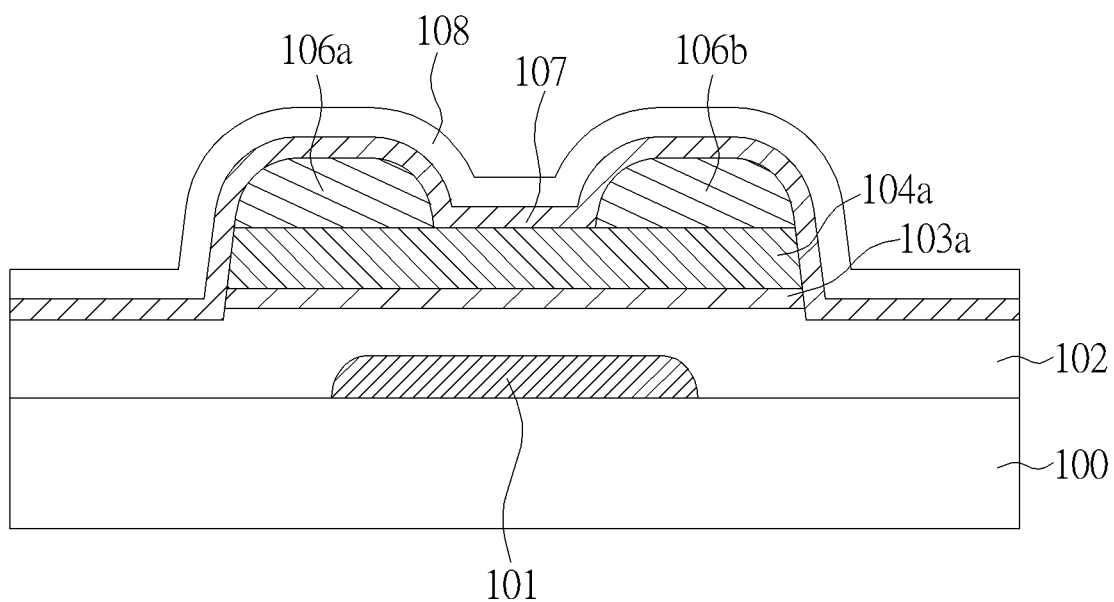
FIG. 4 illustrates a cross-sectional view of forming a second oxide semiconductor film and a gate insulating film over the pattern of the oxide semiconductor device according to one embodiment.

After the pair of source and drain electrodes 106a and 106b are formed on top of the first semiconductor film 104a, please refer to FIG. 4, the second oxide semiconductor film 107 and the gate insulating film 108 are formed over the first oxide semiconductor film 104a and the pair of source and drain electrodes 106a and 106b.

After the second oxide semiconductor film 107 and the gate insulating film 108 are formed, please refer to FIG. 5, the gate electrode 109 is formed so as to overlap with the second oxide semiconductor film 107a with the gate insulating film 108a provided therebetween. The patterned gate electrode 109 may be formed by following steps: first, a conductive gate film is conformally formed by a sputtering method, a vacuum evaporation method, a pulsed laser deposition (PLD) method, a thermal CVD method or the like over the gate insulating film 108, and then a mask defining gate pattern is formed over the conductive gate film by a lithography process. Next, the conductive gate film is partly etched using the mask to form the gate electrode 109. The second oxide semiconductor film 107 and the gate insulating film 108 are also partly etched in this etch process with the conductive gate film to form the second oxide semiconductor film 107a with the gate insulating film 108a overlapping with the gate electrode 109. After that, the mask is removed. Note that the gate electrode 109 may be formed by an electrolytic plating method, a printing method, an ink-jet method, or the like instead of the above formation method. To electrically connect the gate electrode 109 to the back gate 101, an opening (not shown) that reaches the back gate 101 may be formed in the gate insulating film 108a and the base insulating film 102.

Through the above steps of process flow as shown in FIGS. 1-5, an exemplary oxide semiconductor device is manufactured. Please note that the oxide semiconductor device 10 illustrated in FIG. 5 is an exemplary structure of the present invention. Some modification may be made to the device for design requirement or function variety.

Reducing oxygen vacancies in the oxide semiconductor film is very important in order to provide an oxide semiconductor with stable electrical characteristics. Generally, the oxygen vacancies may be reduced by injecting oxygen atoms to the vacancies. A one-time blank oxygen injection is conventionally used in this stage. However, for the oxide semiconductor devices with different pattern densities, sizes and length/width ratios (L/W), it is difficult to reach an optimized doping condition for different oxide semiconductor devices in one substrate or wafer.

The present invention introduces an individual and customized oxygen doping method to solve this problem. Please refer to FIG. 6. There may be multiple oxide semiconductor devices 10 formed on the substrate 100. Depending on the regions of the substrate 100, the oxide semiconductor devices 10 formed thereon may have different or same width/length ratios (W/L) or different pattern densities. The pattern loading effect induced by this regional difference would cause significant process variation. In order to solve the issue of this process variation or to provide customized processes for different regions, it is better to divide the substrate into several regions for individual processes.

Figure 6:
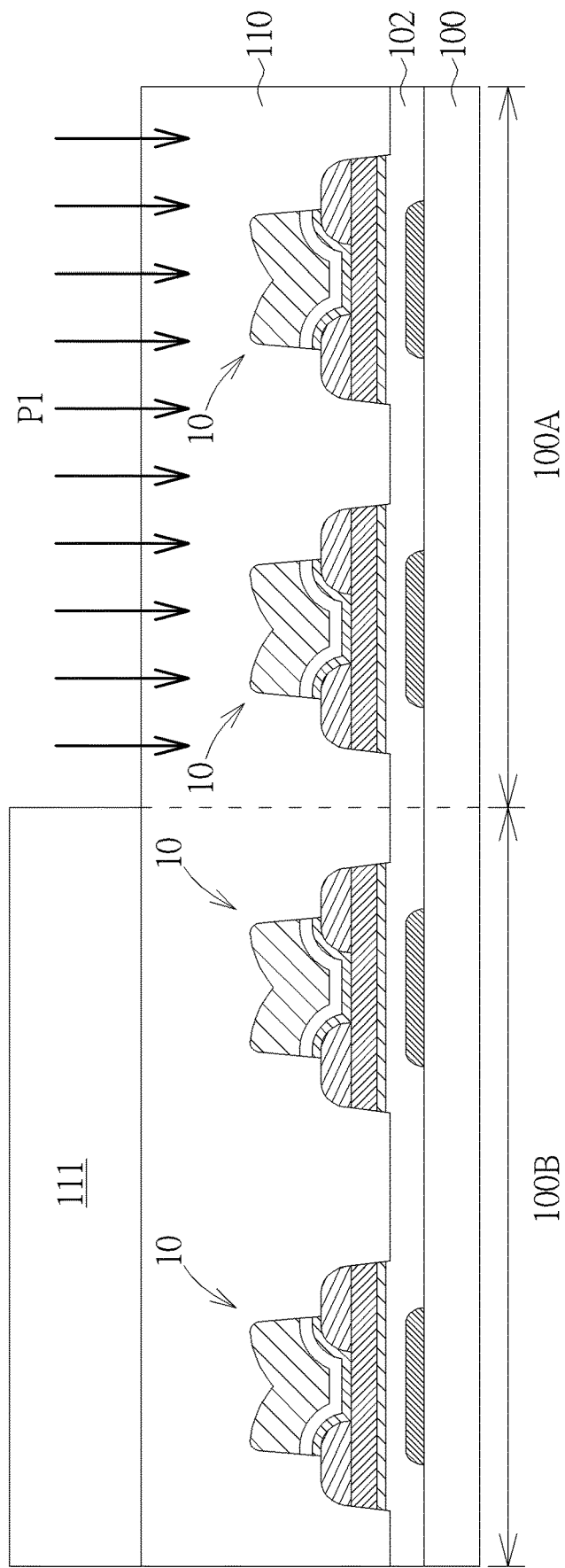
FIG. 6 illustrates a cross-sectional view of performing a first oxygen implantation process on a first implantation region on the substrate according to one embodiment.

For example, as shown in FIG. 6, the substrate 100 is divided into a first region 100A with relatively higher pattern density (dense region) and a second region 100B with relatively lower pattern density (isolated region). An insulating layer 110 is formed covering over the oxide semiconductor devices 10 and the base insulating film 102. The insulating layer 110 may be formed of silicon oxynitride (SiON) by PECVD process. The thickness of the insulating layer 110 may be controlled by a subsequent planarization process such as a chemical mechanical planarization (CMP) process. Then, a first mask 111, such as a photoresist defined by photo-lithography, is formed over the planarized insulating layer 110 on the second region 100B of the substrate 100. The first mask 111 defines the first region 100A to be individually processed first. A first oxygen implantation process P1 is then performed with the first mask 111 on the oxide semiconductor devices 10 in the first region 100A. The candidate of oxygen source in the implantation may be O2, ozone, or any other chemical which can provide ionized oxygen or oxygen radical. The implantation dosage, energy and intensity may be determined depending on the regional circumstances and device characteristics.

Figure 7:
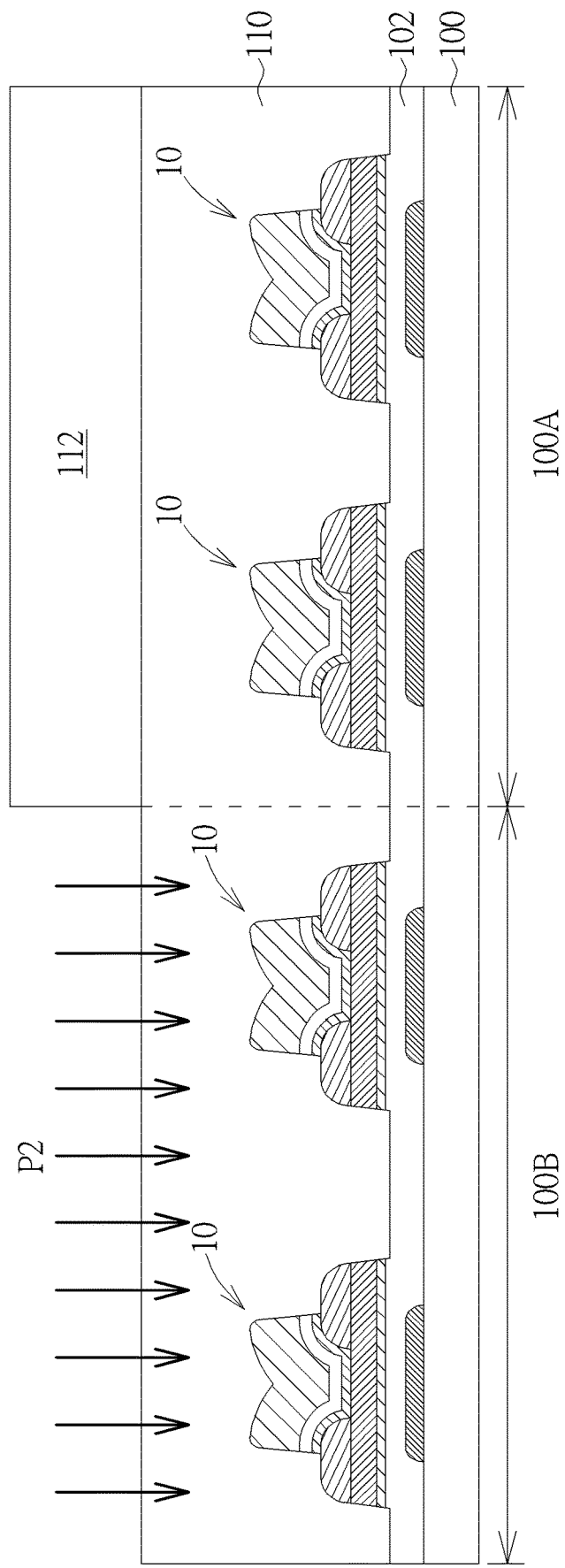
FIG. 7 illustrates a cross-sectional view of performing a second oxygen implantation process on a second implantation region on the substrate according to one embodiment.

Subsequently, please refer to FIG. 7, after the first oxygen implantation process P1 is performed, the first mask is removed. Then, a second mask 112, such as a photoresist defined by photo-lithography, is formed over the planarized insulating layer 110 on the first region 100A of the substrate 100. The second mask 112 defines the second region 100B to be processed individually from the first region 100A. A second oxygen implantation process P2 is then performed with the second mask 112 on the oxide semiconductor devices 10 in the second region 100B. After the second oxygen implantation process P2, the second mask 112 is removed. Next, an annealing process is performed concurrently on the oxide semiconductor devices 10 in the two regions to help the diffusion of the oxygen atom and to reduce the oxygen vacancies after the first and second oxygen implantation processes P1 and P2.

In comparison to conventional one-time blank oxygen injection, since the oxide semiconductor devices 10 in two regions are oxygen-doped with different, customized implantation dosages and intensities depending on their regional circumstances and device characteristics in the present invention, the resulting oxide semiconductor devices 10 would have a small variation (for example, reduced threshold voltage shift) in electrical characteristics and high reliability in some cases. The issue of pattern dependency or device/process variation may be appropriately solved. Please note that the processes shown in FIG. 6 and FIG. 7 may be repeated if there are more individually defined regions on the substrate 100 in order to provide a more precise process control and customization.

Alternatively, the individual oxygen implantations P1 and P2 described above may be performed in different way. A region may be subject to two or more oxygen implantation processes. For example, the first oxygen implantation P1 may be a blank oxygen implantation performed both on the first region 100A and the second region 100B. Then, the first mask 111 is formed on the second region 100B to define the first region 100A. A second oxygen implantation P2 is then performed on the first region 100A. In this case, the oxide semiconductor devices 10 in the first region 100A may subject to two oxygen implantation processes.

Additionally, the individual oxygen implantations P1 and P2 may also be performed before the formation of the gate electrode 109, the gate insulating film 108a and the second oxide semiconductor film 107a.

Figure 8:
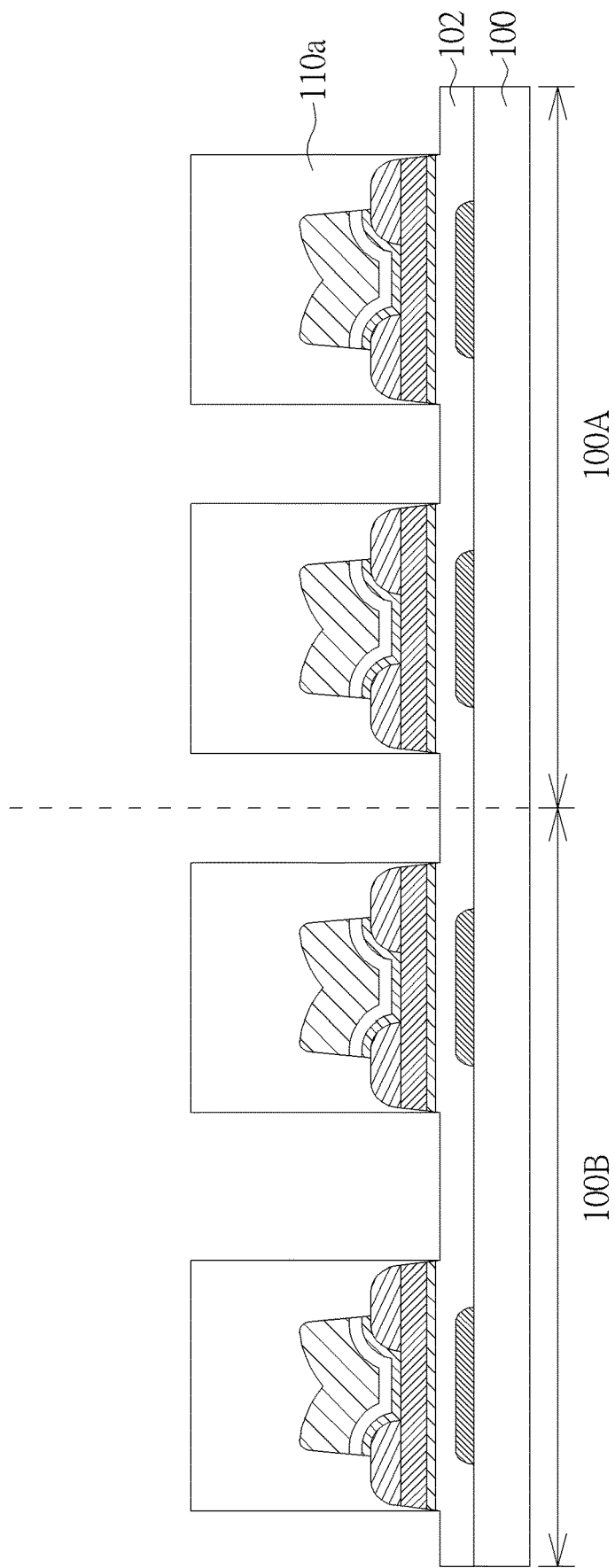
FIG. 8 illustrates a cross-sectional view of patterning the insulating layer over the oxide semiconductor devices according to one embodiment.

Next, please refer to FIG. 8, after the first and second oxygen implantations P1 and P2, the insulating layer 110 are patterned by a lithography method, so that only the areas of oxide semiconductor device 10 (e.g. the area of gate electrode and source/drain electrodes) are covered by the patterned insulating layer 110a. This patterning step may help to define a more precise region for each oxide semiconductor device, thereby achieving a more high sealing efficiency in subsequent sealing processes.

Figure 9:
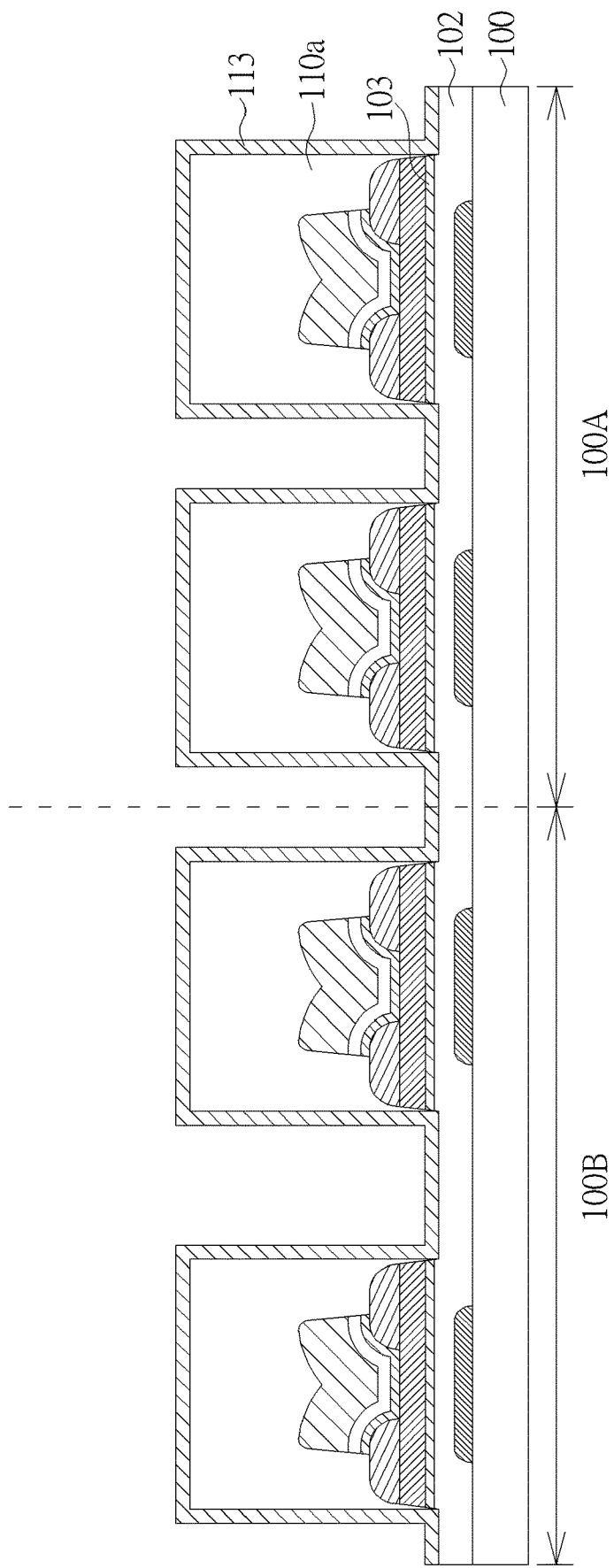
FIG. 9 illustrates a cross-sectional view of forming a conformal top blocking film over the patterned insulating layer according to one embodiment.

After the insulating layer 110a is patterned, please refer to FIG. 9, a conformal top blocking film 113 is formed over the patterned insulating layer 110a and the base insulating film 102. The top blocking film 113 serves as a barrier film like the bottom blocking film 103a to block oxygen, hydrogen, water, and the like. This means that the top blocking film 113 can prevent hydrogen and water from entering the oxide semiconductor film of the device from the outside and can prevent oxygen in the oxide semiconductor film from being released to the outside. As the barrier film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film and a hafnium oxynitride film can be given as examples. The top blocking layer 113 may be formed by a sputtering method, a CVD method, an evaporation method, or the like. Since the device regions are precisely defined in previous step, it is clearly shown in FIG. 9 that the top blocking layer 113 and bottom blocking layer 103 completely enclose the oxide semiconductor devices to provide an excellent sealing effect.

Figure 10:
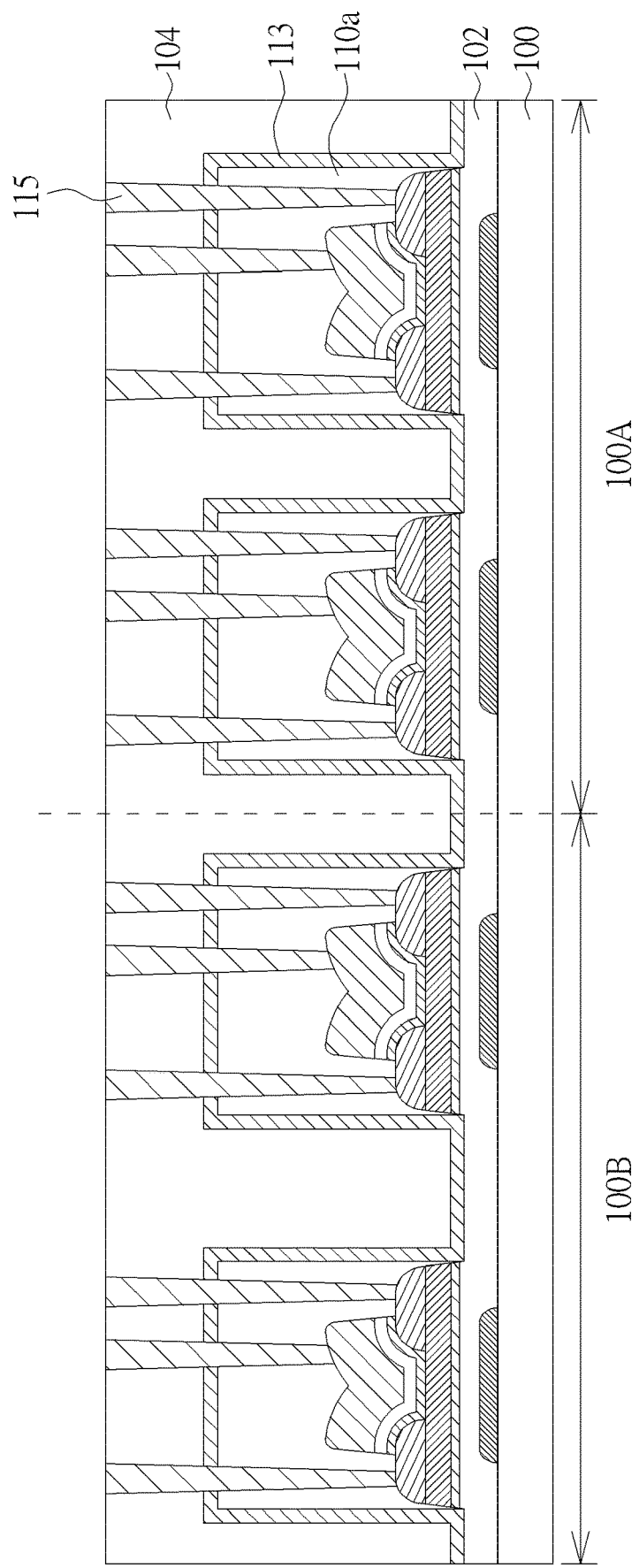
FIG. 10 illustrates a cross-sectional view of forming an inter-metal dielectric and contact plugs over the oxide semiconductor devices according to one embodiment.

Finally, after the oxide semiconductor devices are sealed, please refer to FIG. 10, a planarized inter-metal dielectric 114, such as a SiON layer, is formed over the top blocking layer 113 by a PECVD process. Then, contact holes and contact plugs 115 may be formed through the inter-metal dielectric 114, the top blocking layer 113 and the patterned insulating layer 110a, to electrically connect the oxide semiconductor devices to the outer circuit.

The oxide semiconductor device presented in the present invention may be used as or modified into various electronic components, such as a CMOS circuit with low off-state current, an analog switch, a memory device with unlimited number of write cycles, a RF tag with extremely high reliability, an organic electro-luminescent (EL) display device with low power consumption, or even a novel solar cell.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oxide semiconductor device, comprising:
a substrate;
a back gate on said substrate;
a base insulating film over said back gate and said substrate;
a bottom blocking film over said base insulating film;
a first oxide semiconductor film on said bottom blocking film;
a source electrode and a drain electrode on said first oxide semiconductor film and electrically connected to said first oxide semiconductor film;
a second oxide semiconductor film over said first oxide semiconductor film and said source electrode and said drain electrode;
a gate insulating film on said second oxide semiconductor film;
a gate electrode on said second oxide semiconductor film with said gate insulating film therebetween;
an insulating layer aligning with an area of said oxide semiconductor device and covering said gate electrode, said source electrode and said drain electrode and having a flat top surface from one end to an opposite end and a vertically extending sidewall; and
a top blocking film conformally covering said insulating layer.

2. The oxide semiconductor device of claim 1, further comprising an inter-metal dielectric over said top blocking film.

3. The oxide semiconductor device of claim 2, further comprising contact plugs electrically connected to said gate electrode, said source electrode and said drain electrode through said inter-metal dielectric, said top blocking film and said insulating layer.

4. The oxide semiconductor device of claim 1, wherein said gate electrode, said source electrode and said drain electrode are made of TaN, TiN, ITO, AZO, NBT, IZO, $NaAl_xO_y$, $ZrCa_xO_y$, $Fe_3O_4$, $SrFeCo_xO_y$, $LaMo_xO_y$ or GZO.

5. The oxide semiconductor device of claim 1, wherein said source electrode and said drain electrode directly contact said second oxide semiconductor film.

6. The oxide semiconductor device of claim 1, wherein said top blocking film and said bottom blocking film are selected from the group consisting of aluminum oxide, aluminum oxynitride, gallium oxide, gallium oxynitride, yttrium oxide, yttrium oxynitride, hafnium oxide and hafnium oxynitride.

7. The oxide semiconductor device of claim 1, wherein said bottom blocking film is titanium nitride film or tantalum nitride film.

8. The oxide semiconductor device of claim 1, wherein said insulating layer has a rectangular outer profile.

9. The oxide semiconductor device of claim 1, wherein said top blocking film directly contacts said base insulating film.

* * * * *